Patent Number: 4,764,935
Date of Patent: Aug. 16, 1988

United States Patent [19]
Wilcox et al.

[54] CONTROLLED FAR-FIELD PATTERN SELECTION IN DIFFRACTION-COUPLED SEMICONDUCTOR LASER ARRAYS

[75] Inventors: Jaroslava Z. Wilcox; Michael Jansen, both of Los Angeles; Arnold H. Silver, Rancho Palos Verdes; Jane J. J. Yang, Los Angeles; William W. Simmons, Rancho Palos Verdes, all of Calif.

[73] Assignee: TRW Inc., Redondo Beach, Calif.

[21] Appl. No.: 35,108

[22] Filed: Apr. 6, 1987

[51] Int. Cl.$^4$ .............................................. H01S 3/19
[52] U.S. Cl. ........................................ 372/50; 372/26; 372/92
[58] Field of Search ...................... 372/50, 26, 19, 44, 372/92, 97

[56] References Cited
U.S. PATENT DOCUMENTS 4,661,962  4/1987  Clayton ................................. 372/50

Primary Examiner—James W. Davie
Attorney, Agent, or Firm—Noel F. Heal; Thomas N. Giaccherini

[57] ABSTRACT

A diffraction-coupled semiconductor laser array, and a related method for its operation, the array structure having a diffraction section that is electrically controllable independently of a waveguide section having multiple laser channels. Above a critical level of injected gain in the diffraction region, and with appropriate selection of channel and diffraction region dimensions, stable operation in the in-phase supermode results, with adjacent lasers operating in phase and a single-lobed far-field distribution pattern being produced. Below the critical level of injected gain, the out-of-phase supermode or multimode operation is favored and the narrow single peak of the far-field pattern is no longer present. This mode switching can be used to rapidly modulate operation of the array without directly switching it on and off.

8 Claims, 2 Drawing Sheets

CONTROLLED FAR-FIELD PATTERN SELECTION IN DIFFRACTION-COUPLED SEMICONDUCTOR LASER ARRAYS

BACKGROUND OF THE INVENTION

This invention relates generally to semiconductor laser arrays and, more particularly, to coherent diffraction-coupled laser arrays. Linear arrays of semiconductor arrays have been used for some years as a technique for increasing the power output from semiconductor lasers. For a better understanding of the invention, some background information on semiconductor lasers and laser arrays is first presented.

Basically, a semiconductor laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forward-biased in normal operation, electrons and holes combine in the region of the active layer, and light is emitted. The layers on each side of the active layer have a lower index of refraction than the active layer, and function as cladding layers to confine the light in the plane of the active layer. Various techniques are used to confine the light in a lateral direction as well, and crystal facets are located at opposite ends of the structure, to provide for repeated reflections of the light back and forth in a longitudinal direction. If the diode current is above a threshold value, lasing takes place and light is emitted from one or both of the facets, in the plane of the active layer.

The power of a single semiconductor laser is limited by various physical parameters, but a linear array of coherent emitters, coupled to a corresponding array of evanescently coupled optical waveguides, has been employed to increase the total output power. Instead of the evanescently coupled waveguides, an array might consist of otherwise laterally confined channels and gain regions. One significant disadvantage of linear laser arrays is that the far-field radiation distribution pattern is typically double-lobed.

In general, a coherent array of coupled laser channels can oscillate in one or more of multiple possible configurations, known as array modes. In the most desirable array mode, all of the emitters oscillate in phase. This is known as the 0°-phase-shift array mode, or the in-phase supermode, and it produces a far-field pattern in which most of the energy is concentrated in a single narrow lobe whose angular width is limited, ideally, only by the diffraction of light. A less desirable far-field distribution is obtained when adjacent laser emitters are 180° out of phase. This is the 180°-phase-shift array mode, or the out-of-phase supermode, and it produces two relatively widely spaced lobes in the far-field distribution pattern. Multiple additional modes exist between these two extremes, depending on the phase alignment of the various emitters. Most laser arrays operate in two or three array modes simultaneously and produce one or more beams that are typically two or three times wider than the diffraction limit, with a correspondingly lower peak intensity.

There is an inherent tendency for a linear laser array to oscillate in the out-of-phase supermode. In a conventional linear array, both the optical energy and material gain are concentrated in the same channels, and alternate periodically with lossy interchannel regions. Any array mode having a nonzero intensity in the lossy regions between laser elements will therefore have a higher modal loss, compared with a mode which does not have a nonzero intensity in the regions between laser elements. It is only in the out-of-phase supermode that the field diminishes to zero in all of the regions between lasing elements. Therefore, the interchannel loss contribution to the round-trip propagation loss in the cavity for oscillation in this mode is lower than for oscillation in the other modes. It is apparently for this reason, often referred to in the literature as interchannel evanescent coupling, that the out-of-phase supermode emerges as the dominant mode in most coherent laser arrays. Although this mode minimizes propagation losses, it produces a less than desirable far-field pattern, and much research effort has been directed to structuring the laser array to favor the in-phase supermode and to discriminate against the out-of-phase supermode.

Various diode array geometries have been proposed to force oscillation in a more desirable in-phase supermode. Some of these approaches employ chirped arrays, i.e. arrays in which non-uniform contact stripe width, non-uniform current drives, or non-uniform center-to-center spacings, provide a better spatial match between the in-phase mode and the gain distribution acorss the array width. Other approaches may involve phase interference effects. Specifically, the approach with which this invention is concerned employs the diffraction-coupled array. In a diffraction coupled array, the outputs of an array of parallel waveguides interact through beam diffraction in a laterally unguided region. Light from each waveguide is reflected from an end facet of the unguided region and injected back into the waveguide and into its neighboring waveguides, prinicipally the immediately adjacent waveguides.

If the geometry of the unguided region is correctly proportioned, light will be injected back into the neighboring waveguides with a phase angle of approximately $2\pi$ or an integral multiple of $2\pi$. The in-phase supermode of operation is then reinforced and the array will operate in the in-phase mode and produce a more desirable single-lobed far-field pattern.

This invention is concerned with a specific application of laser arrays in which laser light output must be pulsed for purposes of modulation, as in pulse-code-modulation communication systems. In the past, this has been accomplished by electrically pulsing the current injected into the laser, but this approach has the disadvantage that stable operation of the lasers must be reestablished for each pulse. Lasers are typically subject to transient modes of operation when first turned on, and before stability is achieved. For this reason, the modulation is limited to several hundreds of megahertz. To increase the modulation frequency, it is desirable to run the lasers continuously if possible, and some pulse modulation techniques employ optical or electrooptical elements external to the laser array, to achieve switching of the laser output. Prior to this invention, however, there has been no satisfactory technique for rapidly pulse-modulating a semiconductor laser array directly. The present invention is directed to this end.

SUMMARY OF THE INVENTION

The present invention resides in a semiconductor laser array that can be directly pulse-modulated without interrupting continuous operation of the lasers making up the array. Briefly, and in general terms, the structure of the invention includes a linear array of semiconductor lasers coupled to a specially designed unguided diffraction region. The unguided region has a separate electrical contact stripe, to provide for the application of a different injected current from that applied to the contact stripe in the linear section of the laser array. In one mode of operation, the gain in the unguided region is increased by increasing the injected current above a certain critical level, in a controlled manner that promotes operation in the in-phase mode, and a single-lobed far-field pattern is produced. In a second mode of operation, the unguided region has a different injected current, below the critical level, which permits the influence of evanescent coupling or mode selection in the array to overcome the effect of in-phase diffraction coupling. This leads to operation in the out-of-phase array mode, resulting in a double-lobed far-field pattern.

The essence of the invention is the ability of the structure to be switched in a controlled manner between in-phase and out-of-phase modes of operation without the introduction of significant transients in the operation of the lasers. Using this device for design and operation of a pulse modulation system merely requires the location of a detector at the center of the device's far-field radiation pattern. The intensity of radiation at this point is maximized when the array is operating in its in-phase mode, and is reduced to a much lower level when the array is operating in its out-of-phase mode.

It will be appreciated from the foregoing that the present invention represents a significant advance in the field of semiconductor laser arrays. In particular, the invention provides an array that can be pulse-modulated without discontinuous operation of the laser elements of the array. This is accomplished by switching between in-phase and out-of-phase supermodes of operation, using a separately controllable diffraction-coupling region. Other aspects and advantages of the invention will become apparent from the following more detailed description, taken in conjunction with the accompanying drawings.

DESCRIPTION OF THE PREFERRED EMBODIMENT

Figure 1:
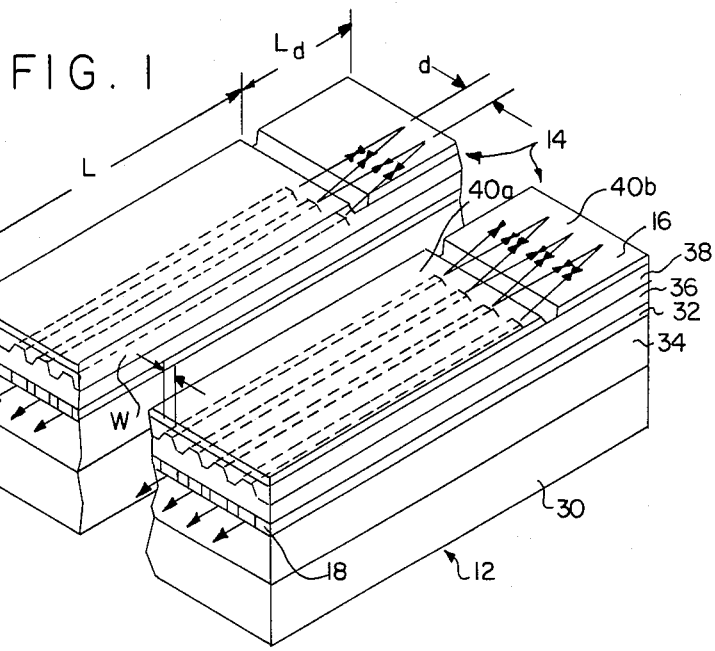
FIG. 1 is a perspective view of a diffraction-coupled semiconductor laser array in accordance with the invention, including multiple laser emitters and waveguides, and a single common unguided region, with a separate current contact, for diffraction coupling of the laesr outputs.

As shown in the drawings for purposes of illustration, the present invention is concerned with a controlled far-field pattern selection in coupled linear arrays of semiconductor lasers. In accordance with the invention, far-field pattern selection is obtained by separately and independently controlling electrodes for injecting current into a linear array section and a common unguided section. An example of a specific application of the far-field control obtainable in diffraction-coupled arrays is pulse modulation communication systems. If a laser array is pulsed by electrical switching the lasers on and off, its frequency of operation is limited by the transient effects resulting from the switching operation. Each time the array is turned on, it takes a some time for transient effects to decay and for the lasers to stabilize in operation.

Basically, in accordance with the method of the invention, a semiconductor laser array is operated in continuous-wave (CW) but may be pulse-code modulated by switching back and forth between an in-phase supermode, in which adjacent lasers are in phase, and an out-of-phase supermode, in which adjacent lasers are 180 degrees out of phase. As is well known, the in-phase supermode produces a far-field radiation pattern with a narrow central peak, but the out-of-phase supermode produces a characteristic double-lobed far-field pattern. If a detector in a communication system is positioned centrally with respect to the laser array, the detector will "see" only the central lobe of the far-field pattern, which then appears to be switched on and off when the array is switched between the in-phase and other modes of operation, such as the out-of-phase array mode.

Figure 4:
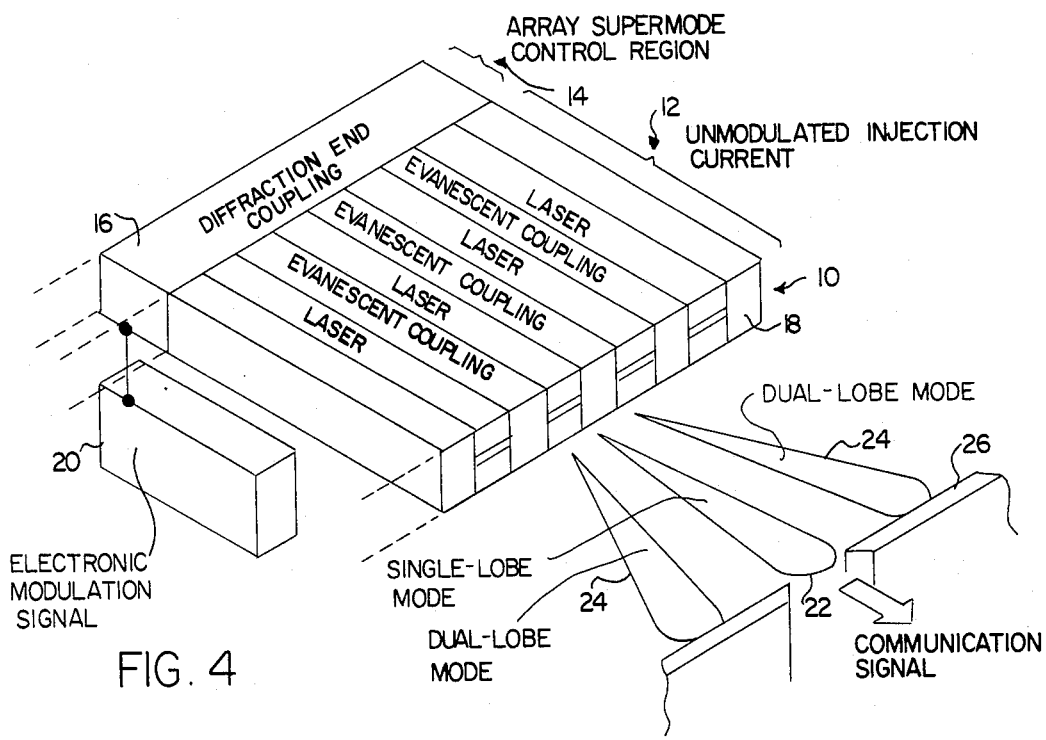
FIG. 4 is a diagrammatic view showing how mode switching of the structure of the invention is applied in a pulse modulation communication system.

FIG. 4 shows a semiconductor laser array, indicated by reference numeral 10, having a conventional waveguide section 12 and a common diffraction coupling region 14, sometimes referred to in this description as an unguided region. The waveguide section 12 has multiple semiconductor lasers, the emissions from which are transversely and laterally guided by appropriate semiconductor layers and optical or gain channels formed within the array. The diffraction coupling region 14 forms a single planar waveguide and is conveniently fabricated integrally with the waveguide section, but with no lateral guiding structure. In FIG. 4, a cleaved facet 16 is formed on the face of the diffraction region opposite the waveguide region, and an opposite cleaved facet 18 is formed at the other end of the waveguide section. Light can be emitted from the laser array either through the facet 18, as shown in FIG. 4, or through the other facet 16. Alternatively, either one or both cleaved facets can be replaced by micromirrors, not shown, oriented at 45 degrees for surface emission, or facet coatings may be used to favor emission from different facets.

As will be described, the waveguide section 12 and the unguided section 14 have electrically separated contact layers. Control of the far-field patterns of the combined structure is effected by varying the amount of current injected into the unguided region 14. Therefore, when a modulation signal is applied to the unguided region 14, as indicated at 20, the resultant far-field pattern of the emitted radiation can be single-lobed with a narrow high central peak, as indicated at 22, or can be a more complex pattern, such as the double-lobed one indicated at 24. A spatial filter 26 may be employed to eliminate the double-lobed output radiation, and the single lobe will then appear to be switched on and off as operation of the structure is modulated by the modulation signal 20.

FIG. 1 shows the array structure 10 in more detail, including a substrate 30, an active layer 32 formed between two cladding layers 34 and 36, a cap layer 38 formed over the upper cladding layer 36, and two contact layers 40a and 40b for applying electrical current to the array. The upper cladding layer 36 in the waveguide section 12 is channeled to provide lateral guiding of light emitted from the array along multiple parallel channels. Other forms of lateral guiding may be used within the scope of the present invention.

Figure 2:
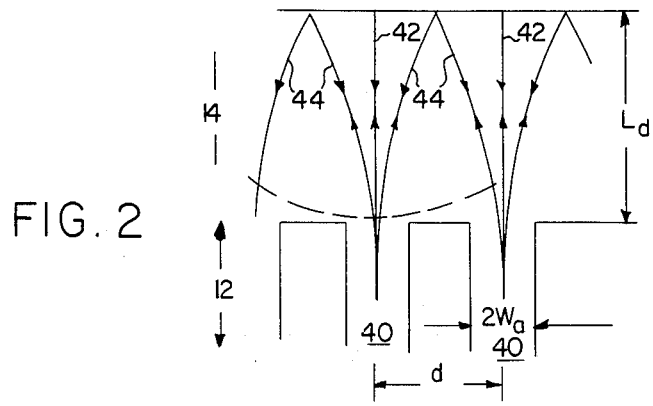
FIG. 2 is a fragmentary diagrammatic plan view of the structure of FIG. 1, showing sample light rays reflected from an end facet of the unguided region.

It has been previously shown that a structure similar to this, but with a common contact layer, is capable of supporting the in-phase mode of operation. This may be best understood from a consideration of FIGS. 2 and 3. FIG. 2 shows a portion of the waveguide region 12 and an adjacent portion of the unguided region 14. As discussed in the background section, an array of lasers in which coupling between the laser elements is dominated by evanescent coupling, tends to operate in the out-of-phase array mode. Light entering into the diffraction region 14 from any of the laser channels, indicated by 40, is diffracted in different directions, but a simplified ray tracing analysis is helpful in understanding the behavior of the structure. First, some rays will be emitted parallel to the channels 40 and will be reflected back into the same channels from which they were emitted, as shown at 42. Other rays will be emitted from one channel and reflected back into an adjacent channel, as indicated at 44. Some rays may also be reflected into more distant channels, but by far the most important reflected light paths are the ones, shown at 42 and 44, straight back into the same channel and into the immediately adjacent channels. By suitable design of the structure, including selection of the length of the diffraction region 14 and the periodic spacing of the channels 40, the difference in the lengths of the optical paths 42 and 44 can be designed to correspond to a phase difference of essentially $2\pi$ or an integral multiple of $2\pi$. Then the light reflected into each channel from the end facet of the unguided region will tend to reinforce the in-phase mode of operation. Basically, the in-phase reflections must be strong enough to overcome the effects of evanescent coupling of the channels.

Figure 3:
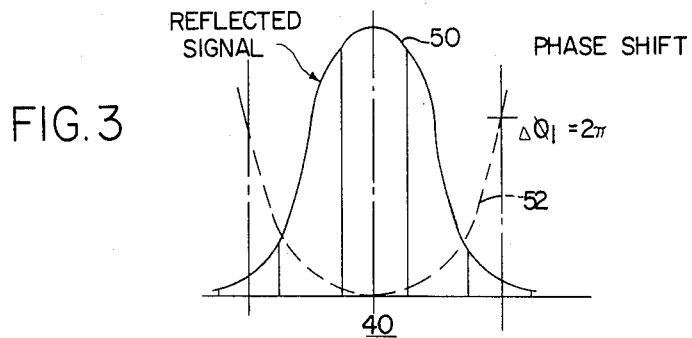
FIG. 3 is a graph showing the spatial variation of reflectivity and phase shift across the array fragment shown in FIG. 2.

FIG. 3 shows the variation of the reflected signal and phase shift across a portion of the width of the array. For a single channel 40 shown in the center of FIG. 3, the reflected signal is a maximum at the center of the channel, and less light is reflected into the two adjacent channels, as indicated by the curve 50. For rays reflected straight back into the same channel, the phase shift is assumed to be zero, as indicated by the curve 52. For rays reflected back to some point displaced from the center line of the channel 40, there is a gradually increasing phase shift because of the increased optical path length required to reach those points. The ideal design is one in which the phase shift at the center of the two adjacent channels is $2\pi$ or a multiple of $2\pi$. In practice, a lesser requirement than this will also result in operation in the in-phase mode. It is only necessary that the cosine of the phase shift angle be greater than zero.

It is critical to the invention that the strength of the in-phase interaction between adjacent channels of the array is also controllable independently by varying the injected gain of the diffraction section 14. Increasing the injected gain of the diffraction section above a critical level results in switching operation of the array from a wide "overmoded" far-field pattern to a nearly diffraction-limited single-lobed output pattern.

Figure 6:
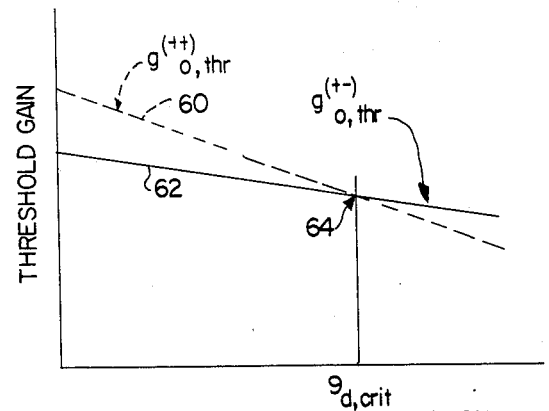
FIG. 6 is a graph showing the variation of threshold gain with the gain in the unguided or resonator section of the structure, for the in-phase and out-of-phase modes of operation.

More specifically, when the injected gain in the diffraction region is increased, by increasing the current applied to that region, the threshold modal gain in the waveguide section decreases. This is because the increased gain in the diffraction region results in a stronger reflected signal and a correspondingly lower need for gain in the waveguide section. The threshold injected gain in the waveguide region is also correspondingly decreased. This relationship (decreasing threshold gain in the waveguide with increasing injected gain in the diffraction region) is true for any supermode of operation. However, there is a vital difference between the supermodes in this regard. Both the modal effective reflectivity (R) and the modal gain (G) are dependent on the mode number $\nu$. In an N-channel laser array, there are N principal modes of operation. It is convenient to assign to the in-phase mode $\nu=1$, while for the out-of-phase mode, $\nu=N$. Because the values of modal reflectivity and modal gain are dependent on the mode number $\nu$, the rate of decrease of the injected threshold gain in the waveguide section of the array with injected gain in the diffraction region is greater for the $\nu=1$ (in-phase) supermode than for the $\nu=N$ (out-of-phase) supermode. This is shown graphically in FIG. 6, which plots the variation of threshold gain in the waveguide region with injected gain in the diffraction region of the structure, for both the in-phase supermode, indicated by curve 60, and the out-of-phase supermode, indicated by curve 62. The rate of decrease of the threshold gain is greater for the in-phase case than for the out-of-phase case.

For relatively low or zero injected gain in the diffraction region, evanescent coupling of the waveguide section of the array will overcome the effect of the diffraction coupling on supermode selection, with the result that the out-of-phase supermode has the lower threshold gain and will dominate operation of the device. However, for an injected gain above the critical point where the two curves intersect, at 64, the strength of the diffraction coupling increases such that the in-phase threshold gain will be lower and the device will therefore stabilize in the in-phase supermode of operation.

For operation of the device of the invention as a pulse-modulated laser, the diffraction region must have its contact layer switched between two injected current values that result in an injected gain in the diffraction region that is switched above and below the critical gain point 64. The lower gain value may be obtained by disconnecting current from the diffraction region during the "off" portion of the switching cycle, or by applying an injected current that is lower than the critical value to achieve mode switching.

Figure 5A:
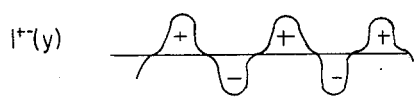
FIG. 5a is a graph showing the variation of optical intensity across the width of the laser array of FIG. 1 when operating in the out-of-phase array mode.
Figure 5B:
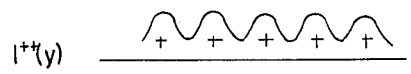
FIG. 5b is a graph showing the variation of optical intensity across the width of the laser array of FIG. 1 when operating in the in-phase array mode.
Figure 5C:
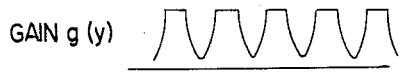
FIG. 5c is a graph showing the variation of gain across the width of the evanescently coupled waveguide section of the laser array of FIG. 1.

FIGS. 5a and 5b show the variation of output intensity across the waveguide section 12 in the out-of-phase and in-phase supermodes of operation, respectively. FIG. 5c shows the spatial variation of gain across the waveguide section, for either mode of operation.

Various specific structures and fabrication techniques may be used to manufacture a laser array following the principles of the invention. By way of example, one array was built having five oxide-restricted ridge-waveguides fabricated on metal-organic chemical vapor deposition (MOCVD) grown multiple-quantum well (MQW) material by wet chemical etching using an etchant of $H_2SO_4:H_2O_2:H_2O$ in a 1:8:10 mixture. The structure had four gallium arsenide (GaAs) wells 140 A (angstroms) thick separated by 70 A of $Ga_{.8}Al_{.2}As$, and sandwiched between 1.5 μm thick layers of $Ga_{.6}Al_{.4}As$ acting as the cladding layers 34, 36. The waveguide center-to-center separation was 6 μm, and the width of the waveguides was less than 3 μm. The contact layers 40a and 40b were separated a 3 μm gap, through which the cap layer was etched away to provide electrical isolation.

It will be appreciated from the foregoing that the present invention represents a significant advance in the field of semiconductor laser arrays. In particular, the invention provides a new technique for pulsed modulation of a laser array without directly switching the laser on and off. The mode switching approach of the invention is inherently faster than directly pulsing the array, permitting more rapid data transmission in a communications application. it will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A diffraction-coupled semiconductor laser array capable of being switched between essentially in-phase and essentially out-of-phase supermodes of operation, the array comprising:
    a waveguide section having an array of semiconductor lasers coupled together by evanescent coupling, and having one at least partially reflective optical emission element;
    a diffraction section connected to the waveguide section, and having an at least partially reflective optical emission element that cooperates with the optical emission element in the waveguide section, to produce lasing of the array;
    wherein the dimensions of the waveguide section and the diffraction section are selected to encourage in-phase lasing of the array;
    and wherein the diffraction section and the waveguide section have electrically isolated contact layers to switch the array, by independent current injection, between two different operating states, one of which promotes lasing in the in-phase supermode and the other of which promotes lasing in the out-of-phase supermode.

2. A semiconductor laser array as defined in claim 1, wherein:
    the waveguide section and the diffraction section are formed integrally as a single structure.

3. A semiconductor laser array as defined in claim 1, and further including:
    means for applying an injected current to the diffraction section, wherein the injected current is switchable between upper and lower values above and below a critical value, and operation in the in-phase supermode results from application of the higher injected current.

4. A semiconductor laser array as defined in claim 3, wherein:
    the lower injected current value is zero.

5. A semiconductor laser array as defined in claim 1, wherein:
    the waveguide section and the diffraction section are integrally formed from gallium arsenide material.

6. A semiconductor laser array as defined in claim 5, wherein:
    the waveguide section includes ridge waveguides fabricated on metal-oxide chemical vapor deposition (MOCVD) grown multiple-quantum well (MQW) material by wet chemical etching.

7. A diffraction-coupled semiconductor laser array capable of far-field pattern discrimination by switching between essentially in-phase and essentially out-of-phase supermodes of operation, the array comprising:
    a linear array section having an array of semiconductor laser waveguides coupled together by evanescent coupling, and having one facet; and
    an integral diffraction section formed adjacent to the end of the waveguide section opposite the waveguide facet, and having a facet that cooperates with the waveguide facet to produce lasing of the array, the diffraction section providing a common region that provides no lateral guiding of light;
    wherein the dimensions of the waveguide section and the diffraction section are selected to encourage in-phase lasing of the array by providing an appropriate path length within the diffraction section for light passing from one laser waveguide to an adjacent waveguide by reflection from the reflective facet in the diffraction section;
    and wherein the diffraction section and the waveguide section have electrically isolated contact layers, to permit the array to be switched between two different operating states, one of which promotes lasing in the in-phase supermode and the other of which promotes lasing in the out-of-phase supermode.

8. A method for operating a diffraction-coupled semiconductor laser array having a waveguide section and a separately controllable diffraction section, the method comprising the steps of:
    applying a relatively constant injection current to the waveguide section of the array, to operate the array in continuous-wave (CW) mode; and
    switching between two injection current levels to the diffraction section of the array, wherein the application of a lower or zero level of injection current to the diffraction section results in array operation in an essentially out-of-phase supermode or overmoded state and produces essentially no central radiation lobe in the far-field pattern emitted from the array, and application of a higher level of injection current above a critical value results in operation dominated by an in-phase supermode and produces a strong single central lobe in the far-field pattern;
    whereby the switching of currents in the diffraction section can be used to modulate laser array operation at high frequencies without directly switching the laser array on and off.

* * * * *